United States Patent

Wanesky

[15] 3,663,326

[45] May 16, 1972

[54] ARTICLE HOLDING METHODS AND ASSEMBLAGE

[72] Inventor: William R. Wanesky, Wescosville, Pa.

[73] Assignee: Western Electric Company, Incorporated, New York, N.Y.

[22] Filed: Jan. 9, 1970

[21] Appl. No.: 1,800

[52] U.S. Cl. .................................... 156/3, 156/17, 156/155, 156/160, 156/305

[51] Int. Cl. ....................................... B32b 31/14, C23f 1/00

[58] Field of Search .................. 156/3, 17, 83, 155, 160, 230, 156/236, 305

[56] References Cited

UNITED STATES PATENTS

| | | | |
|---|---|---|---|
| 3,152,939 | 10/1964 | Borneman et al. | 156/17 X |
| 3,537,925 | 11/1970 | Chen | 156/3 X |

*Primary Examiner*—John T. Goolkasian
*Assistant Examiner*—Lorraine T. Kendell
*Attorney*—W. M. Kain, R. P. Miller and R. Y. Peters

[57] ABSTRACT

Methods involve holding an array of semiconductor devices on a substrate by means of a polyester mesh screen and photoresist material. After the array of devices have been formed by photoresist and etch techniques from a slice waxed to the substrate, the photoresist material is removed from the array but not from the substrate surrounding the array. The polyester mesh screen is placed over and forced against the array and photoresist material while the wax is removed with a solvent. The solvent softens the photoresist material so that the forced screen embeds in the photoresist. Upon removal from the influence of the solvent, the photoresist material rehardens fastening the screen to the substrate with the devices retained between the screen and the substrate in their original orientation and array. The assemblage of substrate, photoresist material and screen permits the devices, no longer waxed to the substrate, to be transported to other operations where the screen is peeled off and the devices removed.

12 Claims, 12 Drawing Figures

Patented May 16, 1972 3,663,326

5 Sheets-Sheet 1

INVENTOR
W. R. WANESKY
By R. G. Peters
ATTORNEY

ARTICLE HOLDING METHODS AND ASSEMBLAGE

BACKGROUND OF THE INVENTION

This invention relates to methods for holding articles in an oriented array on a support and, more particularly, to improved methods of securing an array of oriented semiconductor devices to a substrate after wax removal, the devices having been previously cemented to the substrate with wax.

The invention is particularly adapted to use in the manufacture of small, fragile, devices, such as integrated circuits of the so-called beam-lead type. Example of these beam-lead devices are disclosed in M. P. Lepselter U.S. Pat. Nos. 3,287,612 and 3,335,338. The invention will be particularly described with respect to the beam-lead devices which comprise a semiconductor body on which leads are formed as integral parts of the device and extend from the body as cantilever beams. The beam leads provide both the electrical and mechanical connections between the device and an electrical circuit formed on a header or substrate. The leads are formed essentially of gold which is electroplated onto a semiconductor body, hereinafter designated a wafer. A typical beam lead is very small, the leads being only 0.4 of a mil thick, 3 mils wide and 9 mils long while a square body may be only 2 mils thick and 18 mils wide.

In the manufacture of these devices, an array of 100 or more, each oriented in the same direction, is made in a slice of semiconductor material, such as silicon, and the beam lead electroplated on the slice to connect with the devices therein. In order to separate the slice into individual beam-lead devices, the slice is secured to a substrate with wax, the lead side being embedded in the wax. The upper surface of the slice is masked with a photoresist material formed into a grid of spaced squares so that the slice is exposed between the squares and each square of the grid covers a device. The exposed slice in the spaces between the squares of the grid is etched to remove the semiconductor material and form the plurality of individual beam-lead devices.

In the prior art, in order to free the devices from the wax on the substrate or support for further handling without disturbing their orientation, the devices were cleaned of the photosensitive coating and temporarily secured to an intermediate holding device with cement. The wax was then dissolved, by means of a solvent which would not attack the cement, and the support or substrate removed, leaving the devices on the intermediate holder still oriented but inverted. Next, the exposed portions of the devices were placed against a carrier plate which exerted an attractive force on the devices. While held against the carrier plate, the cement was removed to release the devices from the intermediate holding device and leave the devices in original orientation on the carrier but now right side up.

It is essential in the manufacture of the devices that the original orientation of the device be maintained for testing and bonding to electrical circuits. Also, these tiny devices must be transported, without bending the beam leads or otherwise damaging the devices, on a support or substrate from which they may easily be removed.

SUMMARY OF THE INVENTION

An object of the invention resides in new and improved methods for holding an oriented array of articles on a support.

Another object of the invention resides in new and improved article holding assemblages.

The present invention contemplates improved methods for holding the devices on or securing them to a support or substrate. More particularly, the invention contemplates removing a photoresist material, which covers the entire slice of material and a larger substrate to which it is waxed, from the devices leaving only a ring of photoresist around the outer periphery of the substrate. A polyester mesh screen is then placed over the devices and substrate and the ensemble placed in a fixture which clamps the polyester mesh against the devices and peripheral photoresist.

Next, the wax is removed by dripping trichlorethylene solvent on the array of devices thus freeing the devices from the substrate. At the same time, the trichlorethylene softens the photoresist so that the polyester mesh embeds in the soft photoresist. When the fixture is removed from the trichlorethylene and cooled, the photoresist rehardens. The photoresist material, therefore, fastens the polyester mesh to the substrate. Since the mesh covers the devices, it holds them on the substrate with their orientation unchanged.

After the fixture is cooled and the photoresist material rehardens, the assemblage of substrate, photoresist and polyester screen fastened to the substrate, with the devices protected and held between the substrate and screen, is removed from the fixture. The devices, maintained in their original orientation and array on the substrate, are now transported to subsequent operations by means of the assemblage.

BRIEF DESCRIPTION OF THE DRAWINGS

Other objects, advantages and features of the invention will be apparent from the following detailed description thereof, in which.

DETAILED DESCRIPTION

Figure 1:
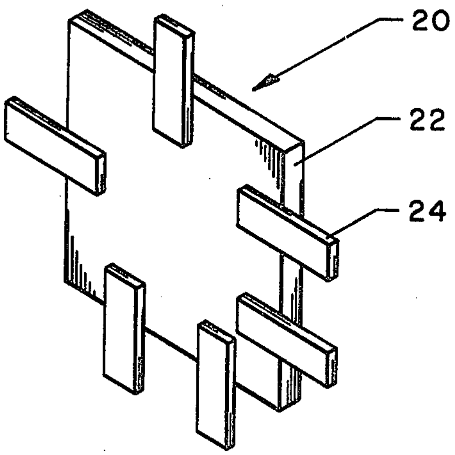
FIG. 1 is an isometric view of a beam-lead semiconductor device.
Figure 2:
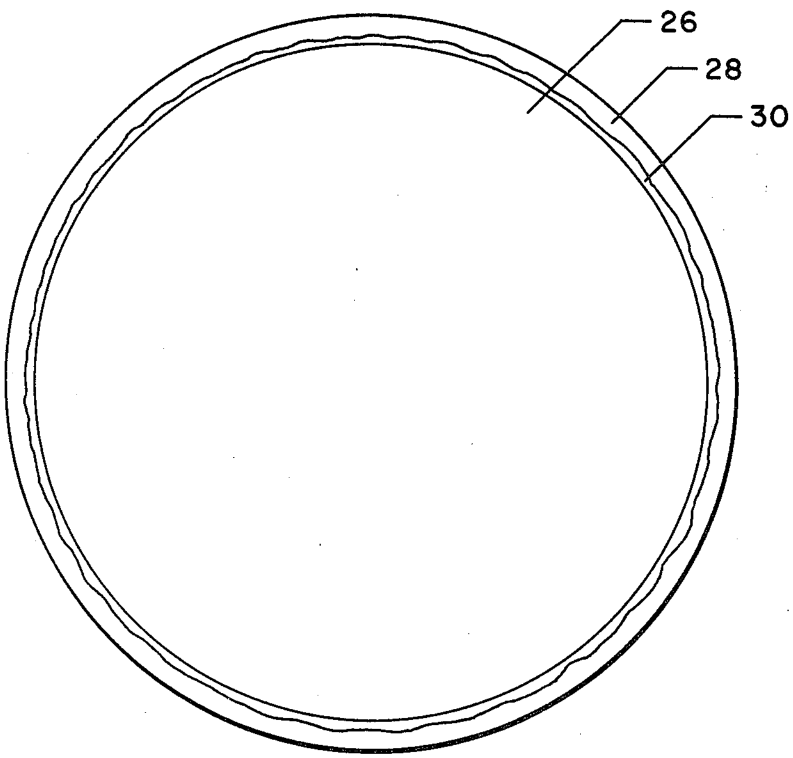
FIG. 2 is a plan view of a substrate to which a slice of semiconductor material containing an array of devices is cemented with wax.

Referring now to FIG. 1, there is shown a semiconductor device 20, such as an integrated circuit. The device includes a body or wafer 22 and a plurality of beam leads 24. An array of 100 or more devices 20 (FIG. 2) is formed in a slice 26 of semiconductor material, such as silicon. While the slice is still whole, the beam leads 24 are formed by electrodeposition to provide connections so that the devices 20 may subsequently be joined to electrical circuits in which they are to be used. For manufacturing reasons it is highly desirable that the devices 20 all have the same orientation and, therefore, they are so oriented in the slice.

The slice is cemented to a support or substrate 28, such as a ceramic, glass or sapphire disk, by means of wax 30 with the beam leads 24 positioned against the substrate. The wax 30 may be of the type sold by the Biwax Corporation under the trade designation B–7050 wax which is filtered to remove all particles over 0.2 of a mil in diameter.

Figures 3, 4:
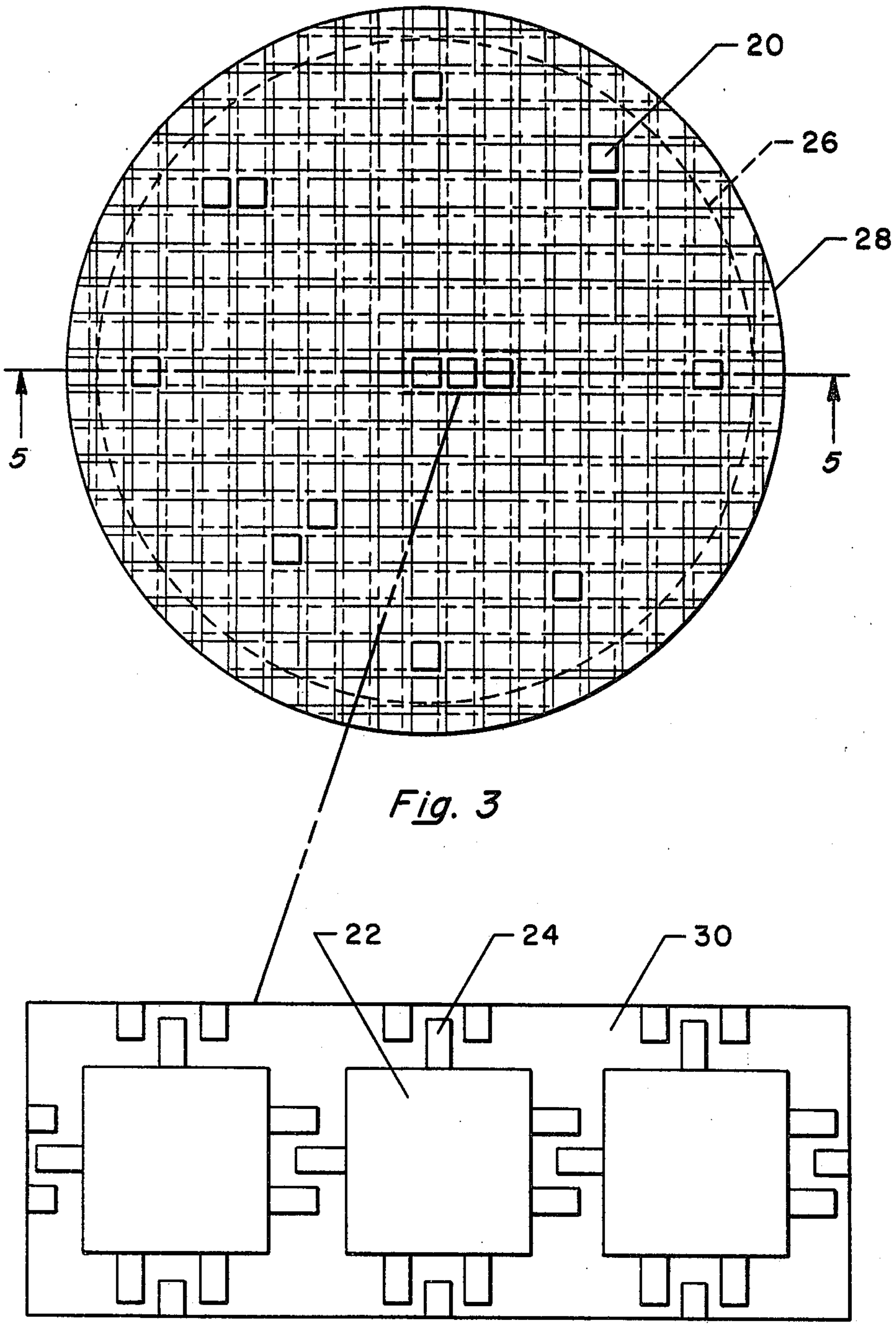
FIG. 3 is a plan view of the substrate and slice after masking with photoresist material and etching of the slice into individual devices.
FIG. 4 is an enlarged plan view of the area within the phantom enclosure of FIG. 3.
Figure 5:
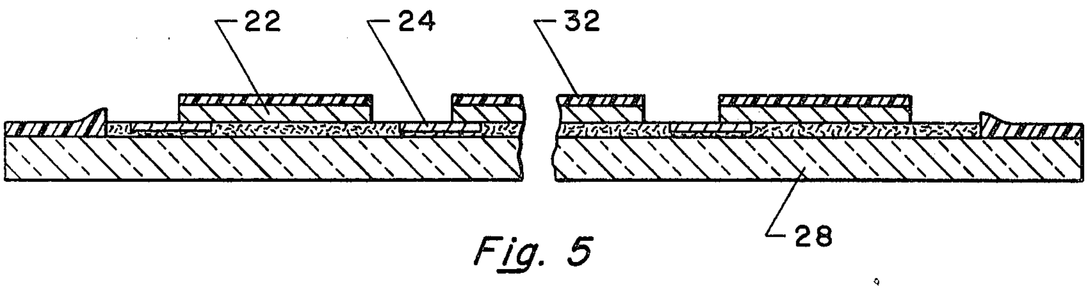
FIG. 5 is a partial cross section along the line 5—5 of FIG. 3.

Referring now to FIGS. 3 and 5 alternately, the entire slice 26 and the substrate 28 are coated with a photoresist material 32 and exposed to an image in the form of a grid or array of rectangles. The grid is registered with the slice so that each rectangle encompasses a wafer 22 in the slice 26. The photoresist material is then developed to remove the material 32 along the lines of the grid where it was exposed. For further information on photoresist materials and pattern generation refer to Berry, Hall and Harris, "Thin Film Technology," Ch. 10, pages 419–466, D. VanNostrand, 1968.

Next, the slice 26 is etched with a suitable etchant to remove the semiconductor material from between the rectangles, thereby separating the slice into an array of individual devices 20 which are still fastened to the substrate 28 by means of the wax 30, as shown in FIG. 3. With respect to FIG. 3, only a few scattered discreet devices are shown, the others being indicated by the phantom lines. The three devices within the enclosure at the center of the array are shown enlarged in FIG. 4. The greater detail indicates that the slice is etched through and the semiconductor material has been completely removed to expose the upper surface of the beam leads 24 which are against the wax 30 on the substrate 28. At this stage, the devices 20 are still covered by the photoresist material 32, refer to FIG. 5, and the beam leads are partially embedded in the wax 30.

Figure 6:
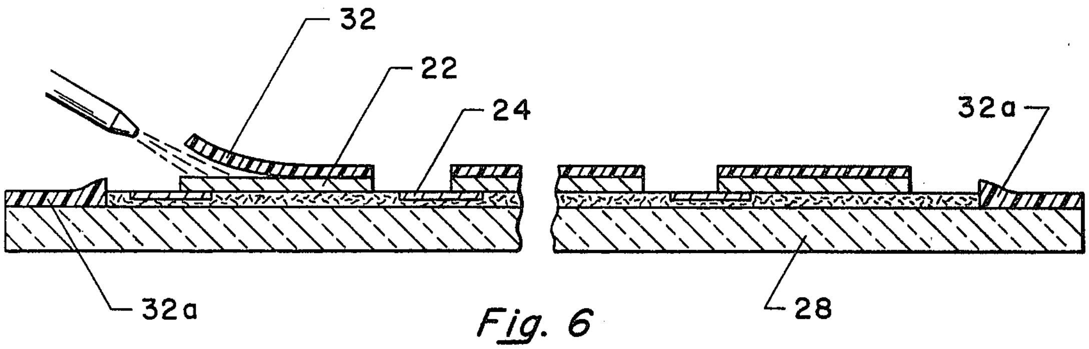
FIG. 6 is a partial cross section similar to FIG. 5 showing the removal of the photoresist from the devices.

Referring now to FIG. 6, the photoresist material 32 is removed by directing a fluid stream at the junction between the photoresist material 32 and the wafer 22, in a manner described in applicant's copending application Ser. No. 647,675 filed on June 27, 1967 now U.S. Pat. No. 3,515,607 issued June 2, 1970. This lifts the material 32 from the wafer 22. The material 32 is removed in this manner from all of the devices 20 but not from the periphery of the substrate 28.

The photoresist material 32 is relatively hard but under the action of certain solvents, such as trichlorethylene, it will soften. However, upon removal from the influence of such a solvent, the photoresist will reharden. This characteristic is important as will be seen in the subsequent explanation.

Figure 7:
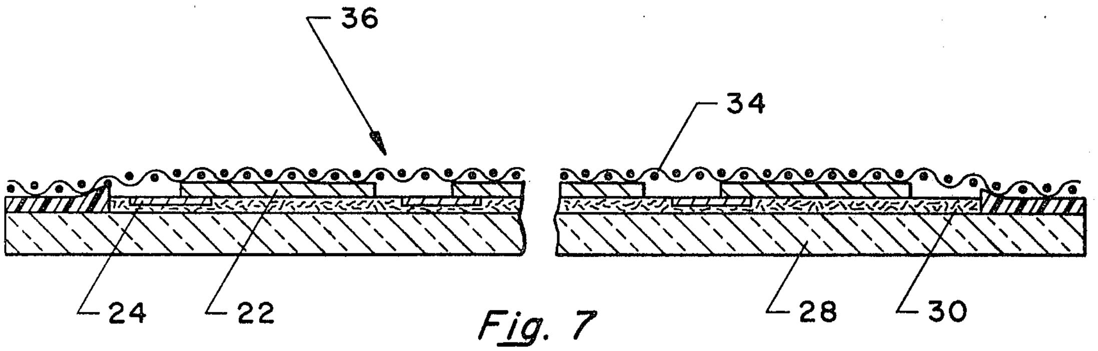
FIG. 7 is a partial cross section similar to FIG. 5 showing the application of a polyester mesh.

After removal of the photoresist material 32 from the devices 20, refer to FIG. 7, a first screen of polyester mesh 34 is placed over the devices and substrate 28. Preferably, the screen 34 is made from a 200 mesh weave of 0.0022 inch diameter polyester monofilament when the wafers 22 are 0.020 inch square or less. For larger wafers, coarser weaves may be used. The interweaving of the warp and woof filaments gives rise to deformable convolutions, as shown schematically in FIGS. 7 and 8, which may be transversely deflected, i.e., flattened, and will return to their original state. As will be seen subsequently, this characteristic is also important.

Figure 8:
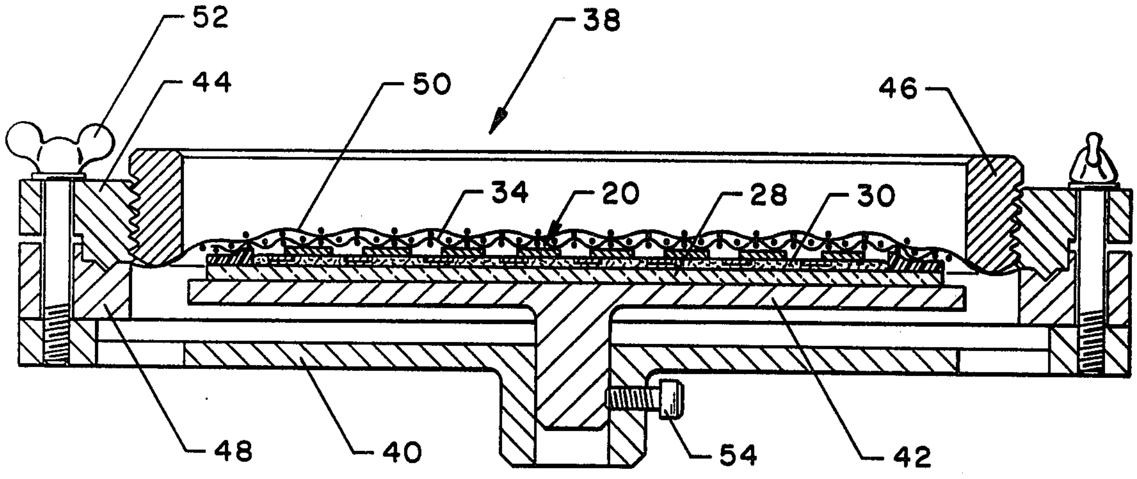
FIG. 8 is a cross section showing the ensemble of substrate, devices and polyester mesh clamped in a wax removal fixture.

The assemblage 36 of the substrate 28, peripheral material 32 and the polyester mesh 34, with the devices 20 supported therein, is then placed in a wax removal fixture, refer to FIG. 8, designated generally by the numeral 38. A second stainless steel screen 50 is stretched and clamped between a first ring 44 and a third ring 48 by screws, not shown. For 0.020 inch square wafers 22 and smaller, a 230 mesh screen woven of 0.0014 inch diameter stainless steel wire is used. For larger wafers, a 120 mesh, 0.0025 diameter wire screen is used.

Wing screws 52 are provided to draw the stainless steel screen 50 down against the assemblage 36. A second ring 46 is screwed into the first ring 44 to apply tension to the screen 50 and maintain it taut. A set screw 54 is provided so that a platform 42 may be adjusted vertically and locked in position. This permits the assemblage 36 to be placed at an elevation such that the screen 50 is certain to apply a downward force against the polyester mesh 34 when the wing screws 52 are tightened.

The force exerted by the screen 50 compresses and flattens the convolutions of the polyester mesh 34. Thus, the convolutions are deflected and attempt to spring back to their original state. As a consequence, when the wax 30 is removed from beneath the devices 20, the polyester mesh 34 expands to force the devices 20 against the substrate 28 and compensates for the thickness of the wax removed. Thus, the mesh continues to press the devices against the substrate after wax removal.

Figure 9:
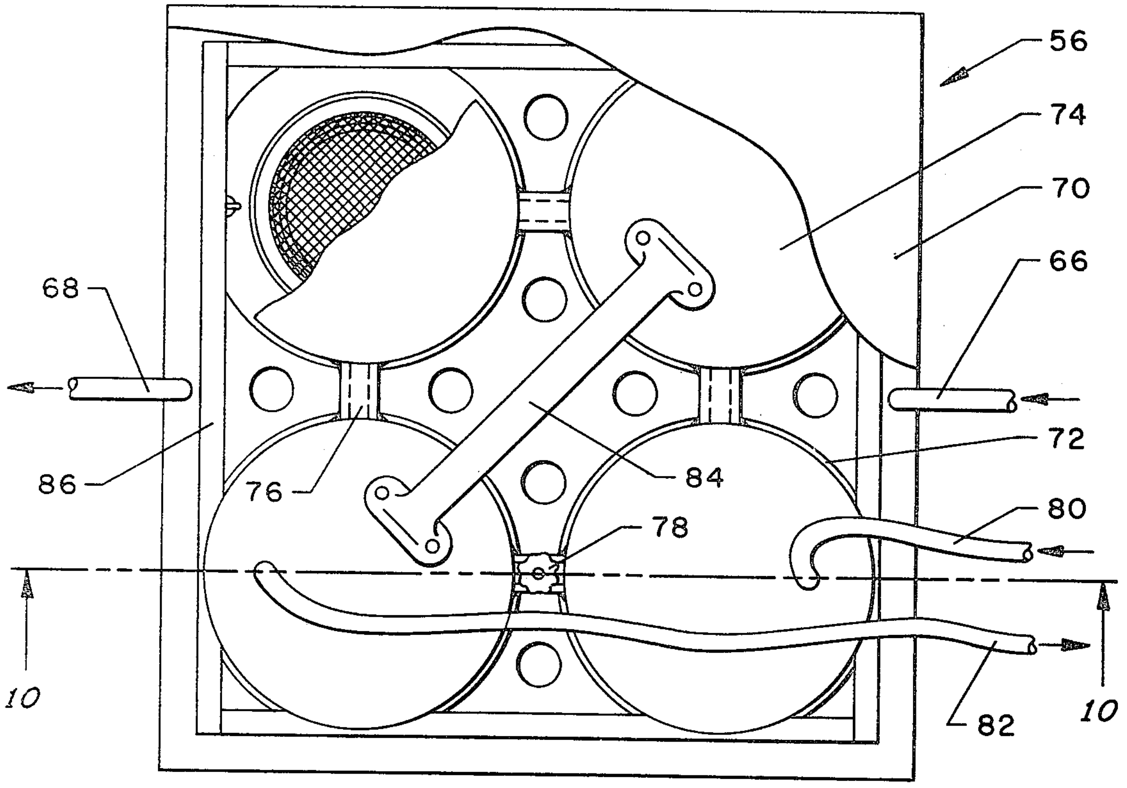
FIG. 9 is a plan view of a wax removal apparatus.
Figure 10:
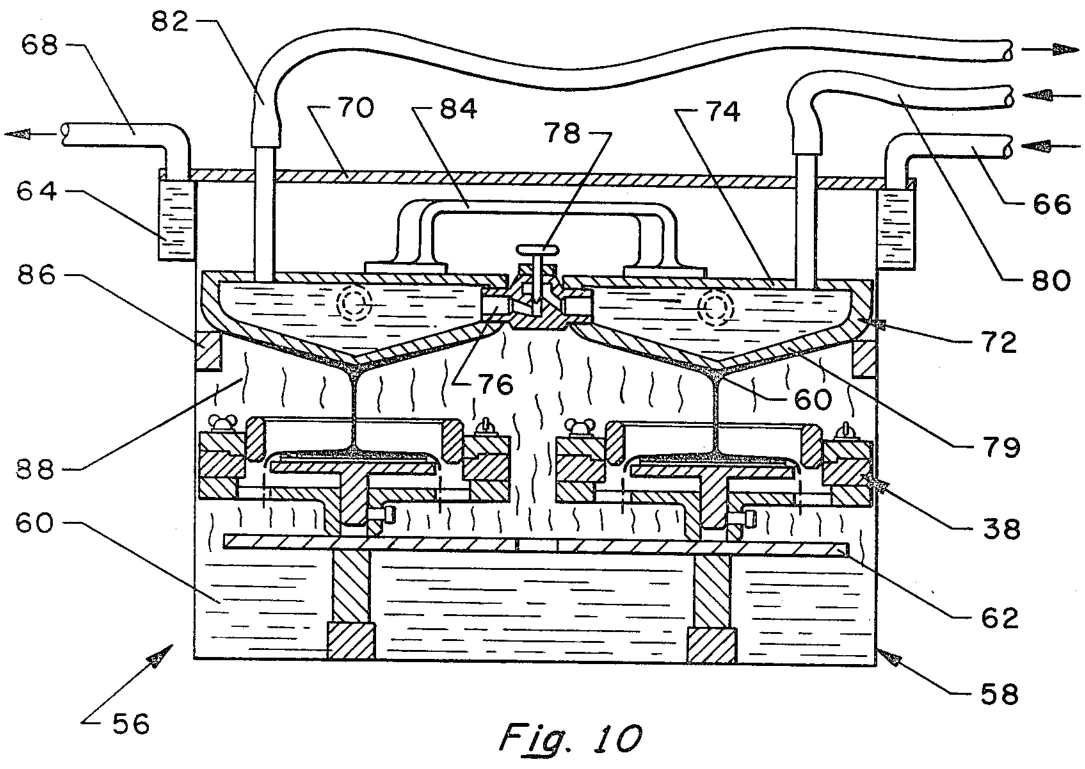
FIG. 10 is a cross section viewed along the line 10—10 of the apparatus of FIG. 9.

Referring now to FIGS. 9 and 10, there is a plan view and cross section of a wax removal apparatus, designated generally by the numeral 56. The apparatus includes a container 58 partially filled with a vaporizable solvent 60, such as trichlorethylene. A fixture support 62 is provided for holding the wax removal fixtures 38 above the surface of the solvent 60. At the upper edge of the container 58, a water cooling jacket 64 is provided to condense and prevent the escape of solvent vapor 88 which is generated by virtue of a heater (not shown) for vaporizing the solvent. Cooling water is admitted to the jacket 64 through an inlet 66 and exits through an outlet 68. As an added precaution, a cover 70 is provided to prevent the escape of vapor from the apparatus 56.

The apparatus 56 also includes a condensing unit, designated generally by the numeral 72, which includes four interconnected enclosures 74 each having a conical-shaped bottom 79. Water is admitted to the enclosures through a flexible tube 80 and exits through a flexible tube 82. A handle 84 is fixed to the enclosures 74 so that, with the cooperation of the flexible tubes 80 and 82, the condensing unit 72 may be removed from and inserted in the apparatus 56 without disconnecting the cooling water supply. In addition, ledges 86 are fixed to the walls of the container 56 to support the condensing unit 72.

The diameter of the enclosures 74 and the fixtures 38 are nearly the same. The enclosures 74 fit against the corners of the container 58 with just enough clearance so that the unit 72 may be inserted in and removed from the container. The fixtures 38 are also positioned against the corners of the container 58 with the result that the apexes of the conical bottoms 79 are vertically aligned over the centers of the fixtures 38.

The wax is removed from between the substrate 28 and the devices 20 by heating the solvent 60 to form a vapor 88, which rises and condenses to a liquid on the enclosures 74 because of the cooling water running therethrough, and flows down to a focal point at the apex of the conical bottoms 79. The liquid solvent 60 then drops from the apex to the center of the array of the devices below and runs through the screen 50 and the mesh 34. The solvent 60 then flows outwardly from the center washing the wax from beneath the devices 20. As the wax is removed, the polyester mesh 34 expands taking up the space left by the wax 30 removal. Since only condensed solvent vapor falls on the devices and washes the wax away, the devices are never contaminated by solvent containing impurities.

While the fixtures 38 are in the wax removal apparatus 56, they are heated above room temperature by the action of the hot vapors 88 generated by the wax removal apparatus 56. The action of the heat and the solvent softens the photoresist material 32. The force of the screen 50 on the mesh 34 presses the mesh 34 into the material 32. When the wax removal fixtures 38 are removed from the apparatus 56 and allowed to cool, the assemblages 36 may be removed from the fixture 38. During the cooling, the photoresist material 32 rehardens.

Figures 11, 12:
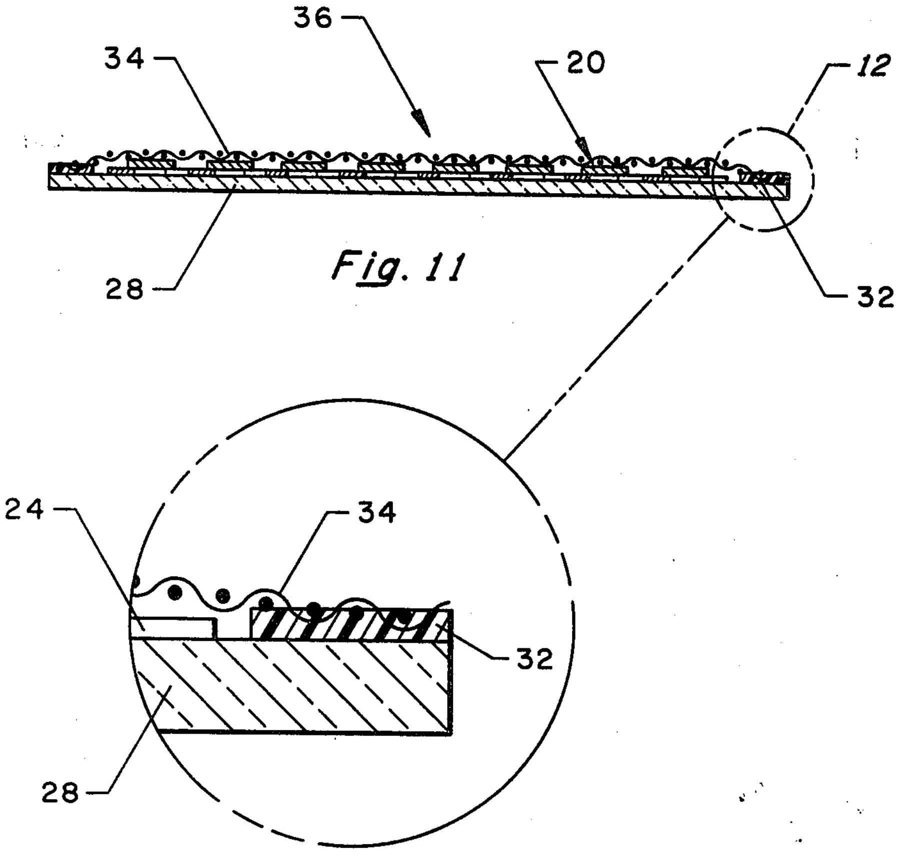
FIG. 11 is a cross section of the assemblage of the substrate, photoresist material and polyester mesh, with the devices held between the substrate and mesh, after removal from the fixture of FIG. 8.
FIG. 12 is an enlarged view of the area within the phantom circle of FIG. 11 showing the polyester mesh embedded in the photoresist material.

Therefore, after an assemblage 36 is removed from the fixture 38 and cooled, refer to FIGS. 11 and 12, the polyester mesh 34 is fastened completely around the perimeter of the substrate 28 by the photoresist material 32. Since the polyester mesh 34 is so fastened to the substrate 28, it holds the devices 20 to the substrate in their original oriented position and array. The devices 20 held within the assemblage may now be transported without disturbing their orientation and without bending the beam leads 24 or otherwise damaging the devices 20.

Although the invention has been described with regard to beam-lead semiconductor devices, the principle involved may be applied to other articles.

What is claimed is:

1. A method of holding an article, which comprises the steps of:

cementing the article on a support;

applying on at least two opposed edge portions of the support a softenable first material;

forcing a layer of a second material against the article and the first material;

softening the first material to embed the forced second material into the softened first material and simultaneously removing the cement from the article and the support; and hardening the first material to secure the second material in the first material, thereby holding the article between the support and second material.

2. A method of holding a plurality of cemented articles on a support after the removal of the cement, which comprises the steps of:

applying, on at least two opposed edge portions of the support, a first material softenable by a cement solvent;

forming the articles cemented to the support between said opposed edge portions of the first material;

forcing a layer of a compressible second material over the articles and the first material to compress said second material against said articles and said first material;

dissolving the cement with the solvent to loosen the articles on the support and to soften said first material, the compressed second material expanding to compensate for a void left by the dissolved cement and to retain the articles against the support, the force embedding said second material in the softened first material; and hardening the first material to secure the second material in the first material and thereby holding the articles between said support and second material.

3. A method of holding an array of cemented articles on a support after removal of the cement by a solvent, which comprises the steps of:

forming an array of articles cemented to a support and surrounded by a normally hard first material that is softenable by the solvent;

placing a layer of compressible and porous second material over the articles and the first material;

exerting a force against the second material to force and compress said second material against the articles and the first material;

dissolving the cement with the solvent to remove the cement, soften said first material and permit said forced second material to embed in the softened first material during the cement removal, the compressed second material expanding to compensate for the cement removal;

removing the support, the articles and said first and second materials from the influence of said solvent to thereby reharden said first material; and releasing the force after the cement is removed and said first material rehardened so that the articles remain held to the support in the array by the second porous material.

4. The method, as recited in claim 3, wherein said first material is a photosensitive, etch-resistant material.

5. The method, as recited in claim 3, wherein forming the array of articles, comprises the steps of:

coating a slice and support with photosensitive etch-resistant material that is softenable with a solvent, the slice being cemented with wax to the support and containing the array of articles to be held after the wax is removed;

exposing the photosensitive material to form a line image of an array of rectangles, the periphery of each rectangle surrounding an article of the array;

developing the array image to remove the etch-resistant material and expose the slice along the lines of the array;

etching through the slice along the lines to separate the slice into an array of individual articles; and removing the etch-resistant material from the articles thereby leaving the etch-resistant material surrounding said array.

6. The method as recited in claim 5 wherein the second material is a polyester mesh screen having interwoven convolutions.

7. The method, as recited in claim 3, wherein the step of dissolving the cement comprises immersing the array in a cement solvent.

8. The method, as recited in claim 3, wherein dissolving the cement comprises the steps of:

condensing trichlorethylene vapor on an inverted conical condenser which is positioned with the apex of the cone above and adjacent the center of the array of articles; and dripping the condensed vapor on the center of the array so that the condensate flows radially from the center of the array outward washing the cement from beneath the articles and softening the first material, the force embedding said forced second material in the softened first material.

9. A method of holding an array of oriented semiconductor devices on a substrate, the devices being in a slice of semiconductor material cemented with wax to the substrate, which comprises the steps of:

coating the slice and substrate with photosensitive etch-resistant material that is softenable with a solvent;

exposing the photosensitive material to form a line image of an array of rectangles, the periphery of each rectangle surrounding a device of the array;

developing the line image to remove the etch-resistant material along the lines of the array;

etching through the slice along the lines to separate the slice into an array of individual devices;

removing the etch-resistant material from the devices while leaving the etch-resistant material surrounding the array of devices;

placing a compressible polyester-mesh first screen over the devices and etch-resistant material;

forcing the first screen against the devices and etch-resistant material with a stainless steel second screen to compress the first screen;

dissolving the cement with solvent to free the devices and soften the etch-resistant material, the compressed first screen embedding in the softened etch-resistant material and expanding to compensate for the cement removal;

removing the substrate, devices and the screens from the influence of said solvent to reharden the etch-resistant material around the first screen, thereby fastening the first screen to the substrate periphery; and releasing the force after the cement is removed and the etch-resistant material rehardened so that the devices remain held to the substrate by the first screen in the oriented array.

10. The method, as recited in claim 9, wherein the step of dissolving the cement comprises:

immersing an assemblage of the substrate, devices and screens in a solvent to remove the wax.

11. The method as recited in claim 9 wherein the solvent is trichlorethylene.

12. Method for holding an array of oriented, beam-lead semiconductor devices on a substrate after wax removal, the devices being in a slice of semiconductor material and cemented with wax to the substrate, which comprises the steps of:

coating the slice and substrate with photosensitive, etch-resistant material that is softenable with a solvent;

exposing the photosensitive etch resistant material to a line image of an array of rectangles, the periphery of each rectangle encompassing one device of the array;

developing the image to remove the etch-resistant material along the lines of the rectangles;

etching through the slice along the lines of the rectangles to separate the slice into an array of individual devices;

removing the etch-resistant material from the devices thereby leaving the etch-resistant material surrounding said array of devices;

placing a first compressible polyester-mesh screen over the devices and etch-resistant material;

forcing the first screen against the devices and the etch-resistant material with a second stainless steel screen to compress the first screen;

condensing trichlorethylene vapor on an inverted conical condenser, the apex of the cone being positioned above and adjacent the center of the array of devices;

dripping the condensed vapor on the center of the array so that the condensate flows radially from the center of the array outward washing the wax from beneath the devices and softening the etch-resistant material, the compressed first screen embedding in the softened etch-resistant material and expanding to compensate for the wax removal;

removing the substrate, devices and screens from the condensate so that the etch-resistant material rehardens around the first mesh screen thereby fastening the first screen to the substrate; and removing the second mesh screen so that the devices are retained in the oriented array on the substrate by the first screen.

* * * * *